United States Patent
Gross et al.

(10) Patent No.: US 11,586,195 B2
(45) Date of Patent: Feb. 21, 2023

(54) ESTIMATING THE REMAINING USEFUL LIFE FOR COOLING FANS BASED ON A WEAR-OUT INDEX ANALYSIS

(71) Applicant: Oracle International Corporation, Redwood Shores, CA (US)

(72) Inventors: Kenny C. Gross, Escondido, CA (US); Anton A. Bougaev, La Jolla, CA (US); Aleksey M. Urmanov, San Diego, CA (US); David K. McElfresh, San Diego, CA (US)

(73) Assignee: Oracle International Corporation, Redwood Shores, CA (US)

( * ) Notice: Subject to any disclaimer, the term of this patent is extended or adjusted under 35 U.S.C. 154(b) by 0 days.

(21) Appl. No.: 17/688,150

(22) Filed: Mar. 7, 2022

(65) Prior Publication Data

US 2022/0187821 A1    Jun. 16, 2022

Related U.S. Application Data

(62) Division of application No. 16/260,082, filed on Jan. 28, 2019, now Pat. No. 11,307,568.

(51) Int. Cl.
*G05B 23/02* (2006.01)
*G06F 1/3215* (2019.01)
*G06F 11/30* (2006.01)
*H05K 7/20* (2006.01)

(52) U.S. Cl.
CPC ....... *G05B 23/0283* (2013.01); *G05B 23/024* (2013.01); *G06F 1/3215* (2013.01); *G06F 11/3058* (2013.01); *H05K 7/2019* (2013.01)

(58) Field of Classification Search
CPC . G05B 23/0283; G05B 23/024; G06F 1/3215; G06F 1/3058; H05K 7/2019
See application file for complete search history.

*Primary Examiner* — Manuel L Barbee
(74) *Attorney, Agent, or Firm* — Park, Vaughan, Fleming & Dowler LLP

(57) ABSTRACT

The disclosed embodiments provide a system that estimates a remaining useful life (RUL) for a fan. During operation, the system receives telemetry data associated with the fan during operation of the critical asset, wherein the telemetry data includes a fan-speed signal. Next, the system uses the telemetry data to construct a historical fan-speed profile, which indicates a cumulative time that the fan has operated in specific ranges of fan speeds. The system then computes an RUL for the fan based on the historical fan-speed profile and empirical time-to-failure (TTF) data, which indicates a TTF for the same type of fan as a function of fan speed. Finally, when the RUL falls below a threshold, the system generates a notification indicating that the fan needs to be replaced.

20 Claims, 4 Drawing Sheets

ESTIMATING THE REMAINING USEFUL LIFE FOR COOLING FANS BASED ON A WEAR-OUT INDEX ANALYSIS

CROSS-REFERENCE TO RELATED APPLICATION

This application is a divisional application of, and hereby claims priority under 35 U.S.C. § 120 to, pending U.S. patent application Ser. No. 16/260,082, entitled "Estimating the Remaining Useful Life for Cooling Fans Based on a Wear-Out Index Analysis," which was filed 28 Jan. 2019.

BACKGROUND

Field

The disclosed embodiments generally relate to techniques for preventing failures caused by degraded cooling fans in business-critical systems, such as computer servers or utility systems. More specifically, the disclosed embodiments relate to a technique for estimating a remaining useful life for a cooling fan based on a wear-out index analysis to facilitate proactive cooling fan replacement.

Related Art

Over the past decade, the number of cooling fans in enterprise computer systems has increased significantly to cope with continual increases in heat dissipation from central-processing units (CPUs), application-specific integrated circuits (ASICs), and high-density memory components. Enterprise computer systems typically provide redundancy in cooling fans, which means that a single failing fan will not cause a server to shut down in a data center. However, there still exist two mechanisms by which degrading fans can cause unexpected server shutdowns. (1) For fans that are controlled to operate at a constant speed, increasing age-related degradation mechanisms typically cause the current from a power-supply unit to gradually increase, which can trip a circuit-breaker in the power-supply unit or an "upstream" power-distribution unit. (2) For fans that are controlled to maintain a constant current, fan speeds will drop with increasing age-related degradation mechanisms to the point where "downstream" CPUs, memory, or other components overheat and cause a "thermal-trip" event, which brings the server down.

Degrading cooling fans also cause vibrations, which can adversely affect the performance of spinning hard disk drives, which are hypersensitive to low-level vibrations. This is because the areal density of hard disk drives has grown exponentially over the last 15 years, which means that a microscopic write head is writing to a track that is only 20 nanometers wide while the platter is spinning at up to 15,000 revolutions per minute (RPMs). As a consequence, any increase in vibrations inside the server can significantly degrade I/O performance for that server.

Hence, what is needed is a technique for proactively identifying cooling fans in critical assets that have a high risk of age-related degradation, so that they can be proactively replaced to prevent subsequent failures and performance degradation in critical assets.

SUMMARY

The disclosed embodiments provide a system that estimates a remaining useful life (RUL) for a cooling fan. During operation, the system receives telemetry data associated with the fan during operation of the critical asset, wherein the telemetry data includes a fan-speed signal. Next, the system uses the telemetry data to construct a historical fan-speed profile, which indicates a cumulative time that the fan has operated in specific ranges of fan speeds. The system then computes an RUL for the fan based on the historical fan-speed profile and empirical time-to-failure (TTF) data, which indicates a TTF for the same type of fan as a function of fan speed. Finally, when the RUL falls below a threshold value, the system generates a notification indicating that the fan needs to be replaced.

In some embodiments, the telemetry data associated with the fan includes: a fan-speed signal; a drive current for the fan; a drive voltage for the fan; a temperature of a component, which is being cooled by the fan; and an I/O rate for a disk drive, which is in proximity to the fan.

In some embodiments, the historical fan-speed profile associates each fan-speed measurement with a specific fan-speed bin for a specific range of fan speeds. This historical fan-speed profile also indicates a TTF for each fan-speed bin. In these embodiments the system computes the RUL for the fan by computing $[TTF(bin_1)*DT(bin_1)+TTF(bin_2)*DT(bin_2)+ \ldots +TTF(bin_N)*DT(bin_N)]-U$, wherein $TTF(bin_i)$ represents the TTF for $bin_i$, wherein $DT(bin_i)$ represents a fraction of time that the fan spends running at a fan speed associated with $bin_i$, and wherein U represents a cumulative operation time for the fan.

In some embodiments, prior to receiving the telemetry data, the system generates the TTF data, which involves operating a pool of fans at different speeds, wherein the pool of fans is divided into separate fan-speed bins, and wherein fans in each fan-speed bin operate within a range of fan speeds associated with the fan-speed bin. While the pool of fans is operating, the system detects failures of fans in each fan-speed bin. Finally, the system determines a TTF for each fan-speed bin based on the detected failures.

In some embodiments, while detecting failures of fans in each fan-speed bin, a failure is detected for a given fan when one or more of the following occurs: a current for the given fan exceeds a threshold current in cases where the given fan is controlled to operate at a fixed fan speed; a speed for the given fan droops below a threshold speed in cases where the given fan is controlled to operate at a fixed drive current; a temperature of a component, which is being cooled by the given fan, exceeds a threshold temperature in cases where the given fan is controlled to operate at a fixed current and voltage; or an I/O rate for a disk drive, which is in proximity to the given fan, falls below a threshold I/O rate.

In some embodiments, while generating the notification indicating that the fan needs to be replaced, the system generates a notification indicating that a subset of fans in the critical asset having shortest RULs need to be replaced.

In some embodiments, the critical asset comprises one of the following: an enterprise computing system; a component in a power generation system; or a component in a power transmission system.

DETAILED DESCRIPTION

Figure 1:
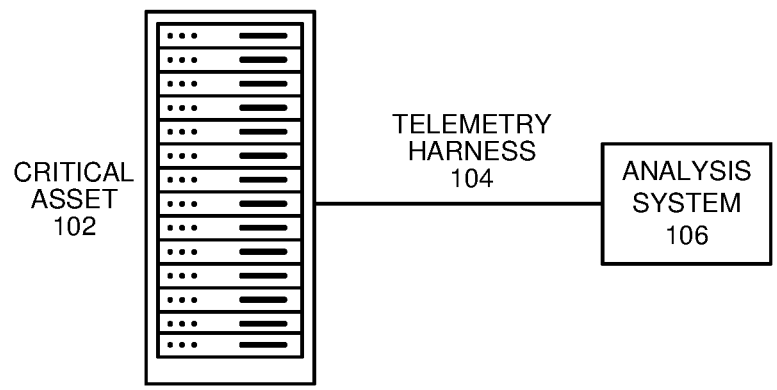
FIG. 1 illustrates a critical system with a telemetry harness in accordance with the disclosed embodiments.

The following description is presented to enable any person skilled in the art to make and use the present embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present embodiments. Thus, the present embodiments are not limited to the embodiments shown, but are to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium. Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Overview

In enterprise computer systems, cooling fans have been steadily increasing in number and in power over the last 30 years to keep pace with Moore's law. In particular, heat dissipated from central-processing units (CPUs) has increased as a result of Moore's law, so both the number of cooling fans and the speeds of the cooling fans have increased commensurately to prevent the CPU circuitry from melting. The conventional approach to providing reliability for cooling fans in enterprise computing servers is "fix on failure." The reason that approach has been adequate for decades, even though fans commonly fail, is that fans have become commoditized and are relatively cheap (☐$20 unit), and fans are deployed in servers with either N+1 or N+2 redundancy, which means that one or two fans can fail and the server will keep functioning.

Although "fix on failure" has been adequate historically, during the past 5-7 years, a new problem with degrading cooling fans has arisen in enterprise computing systems. Degrading cooling fans vibrate more, and disk drives located in the same chassis as the fans have become hypersensitive to low-level vibrations. This has degraded I/O performance in enterprise computing systems. Note that these performance problems, which are caused by increased vibrations from internal cooling fans, are difficult to root-cause because servers do not include expensive vibration accelerometers.

What is needed is a new technique for quantifying the RUL of individual cooling fans in a large population of cooling fans without adding expensive vibration sensors to enterprise servers. Note that it is useful to be able to identify degrading fans not in terms of whether or not the vanes are still turning, but in terms of incipient degradation in fan performance to facilitate proactive replacement before individual fans cause stem failures or performance issues for I/O-intensive workloads.

Aging cooling fans in computer servers cause excessive vibrations. Moreover, most degradation modes that lead to higher vibration levels are "autocatalytic" in nature, which means that the more a degrading fan vibrates, the more quickly the degradation mode accelerates, which accelerates "sympathetic" degradation in adjacent fans. Also, when a degrading cooling fan suffers from reduced performance, downstream components become warmer, which causes fan speeds to increase in parallel fans, further accelerating degradation modes. Hence, the increased vibration produced by just one deteriorating cooling fan can cause degraded disk drive throughput, which eventually results in system I/O timeouts. When I/O performance starts to drop, I/O-intensive workloads need to run longer to complete, which makes the system internals hotter, thereby keeping all system cooling fans running at higher speeds for longer periods of time, which further accelerates incipient degradation mechanisms.

A number of aging mechanisms for cooling fans have been identified, including: bearing out-of-roundness issues, age-related wear-out of motor internals, lubrication dry-out and/or lubrication dust contamination, fan-shaft radial imbalance mechanisms, and/or damaged impeller vanes on fans. All of these aging mechanisms can cause elevated vibration levels in the servers that contain the cooling fans.

Under field conditions in enterprise or cloud computing systems, the aging rate of a cooling fan depends on a fan-speed profile during operation of the cooling fan. This fan-speed profile varies among data centers, racks and associated systems, and depends on ambient conditions, such as humidity, altitude, ambient temperature gradients throughout the data center. Aging also depends on internal server parameters, such as compute loads and memory loads and geometric particularities of specific server configurations. Hence, the mean time to failure (MTTF) of individual cooling fans depends on the factors listed above, and also varies significantly between individual cooling fans, depending on their historical fan-speed operating profiles.

The disclosed embodiments use a telemetry harness to monitor system fan speeds and use results from component-level reliability tests to predict MTTF. For example, FIG. 1 illustrates how a telemetry harness 104 is used to communicate telemetry data from a critical asset 102 to an analysis system 106. Note that in addition to fan speeds and component temperatures, telemetry harness 104 can gather other system parameters, such as voltages, currents, ambient temperatures and system loads. Also note that although the above-described RUL-estimation technique is described in the context of an enterprise computing system, it is not meant to be limited to such enterprise computer systems. In general, this RUL-estimation technique for cooling fans can be applied to any system that uses cooling fans. For example, cooling fans are also commonly used to cool various components in utility systems, such as transformers and power plants.

While monitoring the fan speeds, the disclosed embodiments make use of a bivariate failure criterion, which indicates that a cooling fan has failed if either or both of the following conditions are met: (1) vibration levels caused by the cooling fan become high enough to degrade I/O throughput for a server (e.g., 60% of maximum theoretical throughput); and (2) thermal margins for components being cooled by the cooling fan are not being met. In this way, the disclosed embodiments provide a quantitative framework that enables cooling fans to be proactively replaced with a known degree of confidence before degradation starts to affect the system.

Note that the disclosed embodiments can "infer" vibration levels using I/O-throughput as a proxy variable (because enterprise servers do not have expensive accelerometer-based vibration sensors). In doing so, the disclosed embodiments use a bivariate pattern recognition technique that computes a quantitative RUL estimate for individual fans in a data center, so that cooling fans can be proactively swapped when degrading cooling fans lower overall I/O performance for servers.

Figure 2:
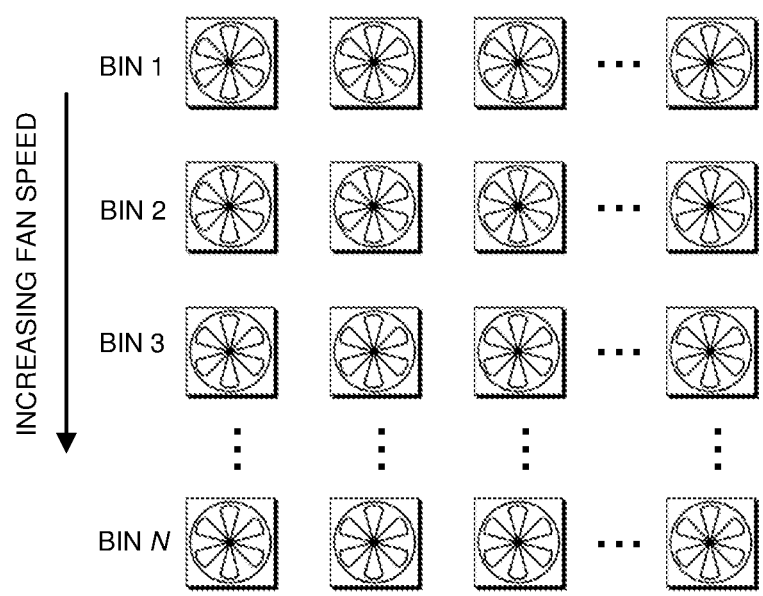
FIG. 2 illustrates an exemplary reliability test based on fan speeds for cooling fans in accordance with the disclosed embodiments.
Figure 3:
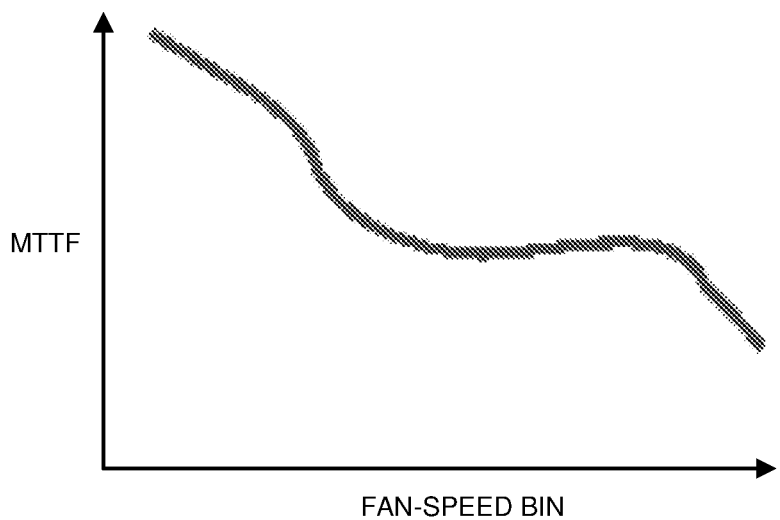
FIG. 3 presents a graph of empirically measured TTFs as a function of fan speeds in accordance with the disclosed embodiments.

FIG. 2 illustrates a reliability test, which is carried out for a large pool of cooling fans. This pool of cooling fans is divided into a number of fan-speed bins, wherein the fans in each fan-speed bin operate at a fixed fan speed or in a narrow range of fan speeds. Note that the fan-speed ranges in the fan-speed bins do not overlap (or overlap only slightly). During the reliability test, the MTTF for fans in each fan-speed bin is determined empirically to produce an expected MTTF for the fans in each fan-speed bin, which is denoted as $TTF(bin_i)$. For example, the results of such a reliability test appear in FIG. 3, which presents a graph of empirically measured TTFs as a function of fan speeds.

As mentioned above, the criteria used to determine that a fan has failed is based on two factors: the first has to do with elevated vibration levels, and the second has to do with thermal issues, wherein both of these factors vary across different fan-speed bins. Note that decreased I/O performance can be used to indicate the effect of a deteriorating cooling fan on system performance without requiring internal vibration sensors to sense the vibration levels. The degraded throughput level, which is required to declare a fan failed can, for example, be 60%. However, this 60% threshold is configurable and can be raised for applications that are known to be highly I/O-intensive and/or for customers who have negotiated stringent service-level agreements (SLAs) for overall I/O performance. Hence, in the disclosed embodiments, a fan is considered to have failed if the condition of the fan has deteriorated to the point where either: (1) the disk drives cannot provide sufficient I/O throughput for applications to run reliably; or (2) internal components in the server become too hot.

Note that the above-described bivariate fan failure criteria is not a static scalar value, as would be the case if one were to use a constant MTTF value for all cooling fans, as is commonly done in the industry. Instead, the bivariate fan-failure criteria is a function of a historical fan-speed profile, which comprises a discrete cumulative function of historical fan speeds over the operational life of the fan. This discrete cumulative function is denoted as $DT(bin_i)$.

Figure 4:
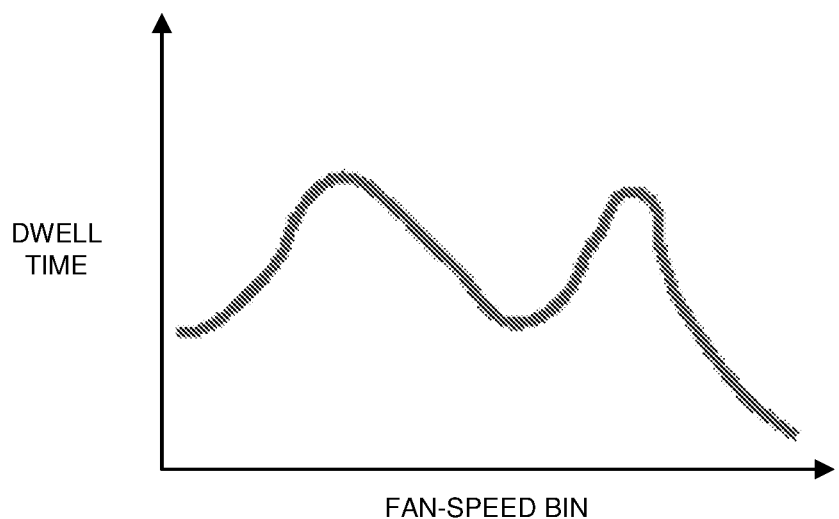
FIG. 4 illustrated a cooling fan-speed dwell time profile in accordance with the disclosed embodiments.

The empirically determined MTTFs for each fan-speed bin combined with the historical fan-speed profiles of each fan determine the "wear-out index" of the fan. For example, an exemplary historical fan-speed profile is illustrated in the graph that appears in FIG. 4, which indicates a "dwell time" for the fan in each fan-speed bin.

The above-described wear-out index can be used to estimate the RUL of this fan using the following equation:

$$RUL = [TTF(bin_1)*DT(bin_1) + TTF(bin_2)*DT(bin_2) + \ldots + TTF(bin_N)*DT(bin_N)] - U,$$

wherein $DT(bin_i)$ is the fraction of a fan's life running at fan speeds corresponding to fan-speed $bin_i$ and U is the fan's total operation time. This bivariate wear-out metric can be used to facilitate preemptive maintenance and/or proactive fan replacement to prevent the undesirable effects and failures described above.

Detecting Anomalies

Figure 5:
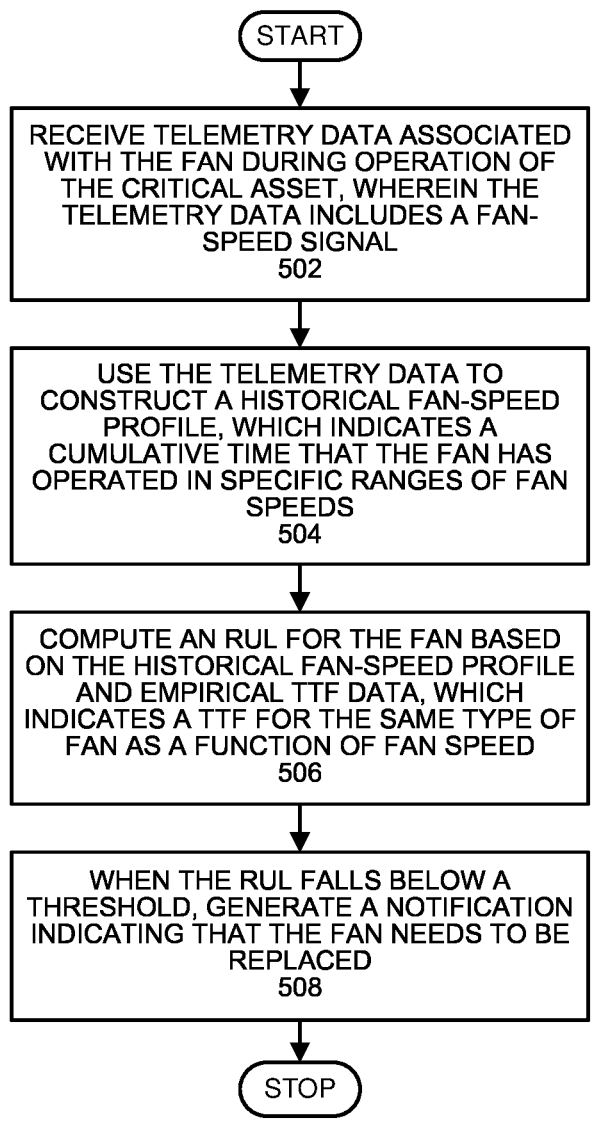
FIG. 5 presents a flow chart illustrating a technique for estimating an RUL for a fan in accordance with the disclosed embodiments.

FIG. 5 presents a flow chart illustrating a technique for estimating an RUL for a fan in accordance with the disclosed embodiments. During operation, the system receives telemetry data associated with the fan during operation of the critical asset, wherein the telemetry data includes a fan-speed signal (step 502). Next, the system uses the telemetry data to construct a historical fan-speed profile, which indicates a cumulative time that the fan has operated in specific ranges of fan speeds (step 504). The system then computes an RUL for the fan based on the historical fan-speed profile and empirical TTF data, which indicates a time-to-failure (TTF) for the same type of fan as a function of fan speed (step 506). Finally, when the RUL falls below a threshold, the system generates a notification indicating that the fan needs to be replaced (step 508).

Figure 6:
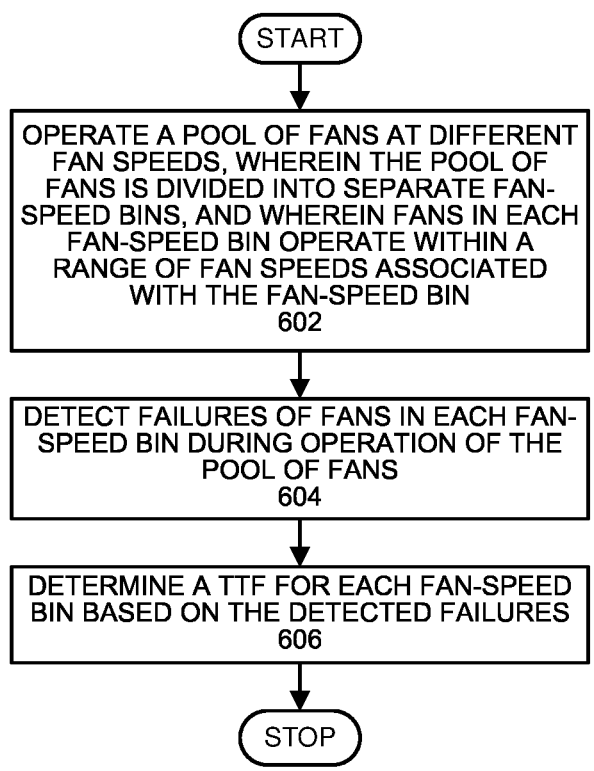
FIG. 6 presents a flow chart illustrating a technique for determining TTFs for different fan-speed bins in accordance with the disclosed embodiments.

FIG. 6 presents a flow chart illustrating a technique for determining TTFs for different fan-speed bins in accordance with the disclosed embodiments. During operation, the system operates a pool of fans at different fan speeds, wherein the pool of fans is divided into separate fan-speed bins, and wherein fans in each fan-speed bin operate within a range of fan speeds associated with the fan-speed bin (step 602). While the pool of fans is operating, the system detects failures of fans in each fan-speed bin (step 604). Finally, the system determines a TTF for each fan-speed bin based on the detected failures (step 606).

Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. A method for estimating a remaining useful life (RUL) for a fan used to cool a critical asset, the method comprising:
   receiving telemetry data associated with the fan during operation of the critical asset, wherein the telemetry data includes:
      a fan-speed signal;
      a drive current for the fan;
      a drive voltage for the fan;
      a temperature of a component that is being cooled by the fan; and
      an I/O rate for a disk drive that is in proximity to the fan;
   using the telemetry data to construct a historical fan-speed profile that indicates a cumulative time that the fan has operated in specific ranges of fan speeds;
   computing an RUL for the fan based on the historical fan-speed profile and empirical TTF data, which indicates a time-to-failure (TTF) for the same type of fan as a function of fan speed; and
   when the RUL falls below a threshold, generating a notification indicating that the fan needs to be replaced.

2. The method of claim 1, wherein the telemetry data is received via a telemetry harness coupled to the critical asset.

3. The method of claim 1, wherein:
   the historical fan-speed profile associates each fan-speed measurement with a specific fan-speed bin for a specific range of fan speeds;
   the historical fan-speed profile indicates a TTF for each fan-speed bin; and
   computing the RUL for the fan involves computing [TTF($bin_1$)*DT($bin_1$)+TTF($bin_2$)*DT($bin_2$)+ . . . +TTF($bin_N$)*DT($bin_N$)]−U, wherein TTF($bin_i$) represents the TTF for $bin_i$, wherein DT($bin_i$) represents a fraction of time that the fan spends running at a fan speed associated with $bin_i$, and wherein U represents a cumulative operation time for the fan.

4. The method of claim 1, wherein prior to receiving the telemetry data, the method further comprises generating the TTF data, which involves:
   operating a pool of fans at different fan speeds, wherein the pool of fans is divided into separate fan-speed bins, and wherein fans in each fan-speed bin operate within a range of fan speeds associated with the fan-speed bin;
   detecting failures of fans in each fan-speed bin during operation of the pool of fans; and
   determining a TTF for each fan-speed bin based on the detected failures.

5. The method of claim 4, wherein while detecting failures of fans in each fan-speed bin, a failure is detected for a given fan when one or more of the following occurs:
   a current for the given fan exceeds a threshold current in cases where the given fan is controlled to operate at a fixed fan speed;
   a speed for the given fan droops below a threshold speed in cases where the given fan is controlled to operate at a fixed drive current;
   a temperature of a component, which is being cooled by the given fan, exceeds a threshold temperature in cases where the given fan is controlled to operate at a fixed current and voltage; and
   an I/O rate for a disk drive, which is in proximity to the given fan, falls below a threshold I/O rate.

6. The method of claim 1, wherein generating the notification indicating that the fan needs to be replaced involves generating a notification indicating that a subset of fans in the critical asset having shortest RULs need to be replaced.

7. The method of claim 1, wherein the critical asset comprises one of the following:
   an enterprise computing system;
   a component in a power generation system; and
   a component in a power transmission system.

8. A non-transitory, computer-readable storage medium storing instructions that when executed by a computer cause the computer to perform a method for estimating a remaining useful life (RUL) for a fan used to cool a critical asset, the method comprising:
   receiving telemetry data associated with the fan during operation of the critical asset, wherein the telemetry data includes:
      a fan-speed signal;
      a drive current for the fan;
      a drive voltage for the fan;
      a temperature of a component that is being cooled by the fan; and
      an I/O rate for a disk drive that is in proximity to the fan;
   using the telemetry data to construct a historical fan-speed profile that indicates a cumulative time that the fan has operated in specific ranges of fan speeds;
   computing an RUL for the fan based on the historical fan-speed profile and empirical TTF data, which indicates a time-to-failure (TTF) for the same type of fan as a function of fan speed; and
   when the RUL falls below a threshold, generating a notification indicating that the fan needs to be replaced.

9. The non-transitory, computer-readable storage medium of claim 8, wherein the telemetry data is received via a telemetry harness coupled to the critical asset.

10. The non-transitory, computer-readable storage medium of claim 8, wherein:
   the historical fan-speed profile associates each fan-speed measurement with a specific fan-speed bin for a specific range of fan speeds;
   the historical fan-speed profile indicates a TTF for each fan-speed bin; and
   computing the RUL for the fan involves computing [TTF($bin_1$)*DT($bin_1$)+TTF($bin_2$)*DT($bin_2$)+ . . . +TTF($bin_N$)*DT($bin_N$)]−U, wherein TTF($bin_i$) represents the TTF for $bin_i$, wherein DT($bin_i$) represents a fraction of time that the fan spends running at a fan speed associated with $bin_i$, and wherein U represents a cumulative operation time for the fan.

11. The non-transitory, computer-readable storage medium of claim 8, wherein prior to receiving the telemetry data the method further comprises generating the TTF data, which involves:
   operating a pool of fans at different fan speeds, wherein the pool of fans is divided into separate fan-speed bins, and wherein fans in each fan-speed bin operate within a range of fan speeds associated with the fan-speed bin;
   detecting failures of fans in each fan-speed bin during operation of the pool of fans; and
   determining a TTF for each fan-speed bin based on the detected failures.

12. The non-transitory, computer-readable storage medium of claim 11, wherein while detecting failures of fans in each fan-speed bin, a failure is detected for a given fan when one or more of the following occurs:
   a current for the given fan exceeds a threshold current in cases where the given fan is controlled to operate at a fixed fan speed;

a speed for the given fan droops below a threshold speed in cases where the given fan is controlled to operate at a fixed drive current;

a temperature of a component, which is being cooled by the given fan, exceeds a threshold temperature in cases where the given fan is controlled to operate at a fixed current and voltage; and an I/O rate for a disk drive, which is in proximity to the given fan, falls below a threshold I/O rate.

13. The non-transitory, computer-readable storage medium of claim 8, wherein generating the notification indicating that the fan needs to be replaced involves generating a notification indicating that a subset of fans in the critical asset having shortest RULs need to be replaced.

14. The non-transitory, computer-readable storage medium of claim 8, wherein the critical asset comprises one of the following:
an enterprise computing system;
a component in a power generation system; and
a component in a power transmission system.

15. A system that estimates a remaining useful life (RUL) for a fan used to cool a critical asset, comprising:
at least one processor and at least one associated memory; and
a notification mechanism that executes on the at least one processor, wherein during operation, the notification mechanism:
receives telemetry data associated with the fan during operation of the critical asset, wherein the telemetry data includes:
a fan-speed signal;
a drive current for the fan;
a drive voltage for the fan;
a temperature of a component that is being cooled by the fan; and
an I/O rate for a disk drive that is in proximity to the fan;
uses the telemetry data to construct a historical fan-speed profile that indicates a cumulative time that the fan has operated in specific ranges of fan speeds;
computes an RUL for the fan based on the historical fan-speed profile and empirical TTF data, which indicates a time-to-failure (TTF) for the same type of fan as a function of fan speed; and
when the RUL falls below a threshold, generates a notification indicating that the fan needs to be replaced.

16. The system of claim 15, further comprising a telemetry harness for communicating the telemetry data.

17. The system of claim 15, wherein:
the historical fan-speed profile associates each fan-speed measurement with a specific fan-speed bin for a specific range of fan speeds;
the historical fan-speed profile indicates a TTF for each fan-speed bin; and
while computing the RUL for the fan, the notification mechanism computes $[TTF(bin_1)*DT(bin_1)+TTF(bin_2)*DT(bin_2)+ \ldots +TTF(bin_N)*DT(bin_N)]-U$, wherein $TTF(bin_i)$ represents the TTF for $bin_i$, wherein $DT(bin_i)$ represents a fraction of time that the fan spends running at a fan speed associated with $bin_i$, and wherein U represents a cumulative operation time for the fan.

18. The system of claim 15, wherein prior to receiving the telemetry data, the system generates the TTF data, wherein while generating the TTF data, the system:
operates a pool of fans at different fan speeds, wherein the pool of fans is divided into separate fan-speed bins, and wherein fans in each fan-speed bin operate within a range of fan speeds associated with the fan-speed bin;
detects failures of fans in each fan-speed bin during operation of the pool of fans; and
determines a TTF for each fan-speed bin based on the detected failures.

19. The system of claim 18, wherein while detecting failures of fans in each fan-speed bin, the system detects a failure for a given fan when one or more of the following occurs:
a current for the given fan exceeds a threshold current in cases where the given fan is controlled to operate at a fixed fan speed;
a speed for the given fan droops below a threshold speed in cases where the given fan is controlled to operate at a fixed drive current;
a temperature of a component, which is being cooled by the given fan, exceeds a threshold temperature in cases where the given fan is controlled to operate at a fixed current and voltage; and
an I/O rate for a disk drive, which is in proximity to the given fan, falls below a threshold I/O rate.

20. The system of claim 15, wherein while generating the notification indicating that the fan needs to be replaced, the notification mechanism generates a notification indicating that a subset of fans in the critical asset having shortest RULs need to be replaced.

* * * * *